(12) United States Patent
Iijima

(10) Patent No.: US 9,337,062 B2
(45) Date of Patent: May 10, 2016

(54) HIGH FREQUENCY MODULE AND MANUFACTURING METHOD THEREOF

(71) Applicant: FUJITSU LIMITED, Kawasaki-shi, Kanagawa (JP)

(72) Inventor: Shinya Iijima, Hadano (JP)

(73) Assignee: FUJITSI LIMITED, Kawasaki (JP)

( * ) Notice: Subject to any disclaimer, the term of this patent is extended or adjusted under 35 U.S.C. 154(b) by 0 days.

(21) Appl. No.: 14/620,646

(22) Filed: Feb. 12, 2015

(65) Prior Publication Data
US 2015/0262842 A1 Sep. 17, 2015

(30) Foreign Application Priority Data
Mar. 17, 2014 (JP) .................................. 2014-053600

(51) Int. Cl.
| | | |
|---|---|---|
| H01L 23/66 | (2006.01) | |
| H01L 21/52 | (2006.01) | |
| H01L 23/00 | (2006.01) | |
| H01L 23/29 | (2006.01) | |
| H01L 21/56 | (2006.01) | |
| H01P 5/107 | (2006.01) | |

(52) U.S. Cl.
CPC ............. *H01L 21/52* (2013.01); *H01L 23/66* (2013.01); *H01L 24/19* (2013.01); *H01L 24/20* (2013.01); *H01L 21/568* (2013.01); *H01L 23/295* (2013.01); *H01L 24/96* (2013.01); *H01L 2223/6627* (2013.01); *H01L 2223/6677* (2013.01); *H01L 2224/04105* (2013.01); *H01L 2924/12042* (2013.01); *H01L 2924/142* (2013.01); *H01L 2924/1815* (2013.01); *H01P 5/107* (2013.01)

(58) Field of Classification Search
CPC ......... H01L 23/66; H01L 2223/66–2223/6694
See application file for complete search history.

(56) References Cited

U.S. PATENT DOCUMENTS

| | | | | |
|---|---|---|---|---|
| 5,202,648 A | * | 4/1993 | McCandless | ........... H01P 5/107 333/26 |
| 7,504,721 B2 | * | 3/2009 | Chen | ........... H01L 25/16 257/691 |
| 8,624,373 B2 | * | 1/2014 | Camiade | ........... H01P 5/107 257/686 |
| 8,901,719 B2 | * | 12/2014 | Ligander | ........... H01L 23/49503 257/664 |
| 8,912,858 B2 | * | 12/2014 | Dayan | ........... H01P 5/107 333/247 |
| 2003/0024633 A1 | * | 2/2003 | Ogura | ........... H01L 23/66 156/250 |
| 2003/0042993 A1 | * | 3/2003 | Sayanagi | ........... H01L 23/66 333/26 |
| 2012/0050125 A1 | * | 3/2012 | Leiba | ........... H01Q 1/2283 343/834 |
| 2012/0248587 A1 | * | 10/2012 | Alleaume | ........... H01L 23/047 257/664 |

FOREIGN PATENT DOCUMENTS

| | | |
|---|---|---|
| JP | H05-343904 | 12/1993 |
| JP | 2002-198712 A1 | 7/2002 |

* cited by examiner

*Primary Examiner* — Benjamin Sandvik
(74) *Attorney, Agent, or Firm* — Kratz, Quintos & Hanson, LLP

(57) ABSTRACT

A high frequency module includes: a semiconductor chip provided over a first surface side of a resin layer; a first waveguide provided over the first surface side of the resin layer and sealed together with the semiconductor chip by a resin; a wire provided over a second surface side of the resin layer and electrically coupled to the semiconductor chip and extending to a position of the first waveguide; a second waveguide bonded to the first waveguide; and a metal plate provided over the first surface side of the resin layer at a position opposite to the first waveguide and electrically coupled to the wire, wherein a part of the wire extending to the position of the first waveguide serves as an antenna coupler.

5 Claims, 5 Drawing Sheets

HIGH FREQUENCY MODULE AND MANUFACTURING METHOD THEREOF

CROSS-REFERENCE TO RELATED APPLICATION

This application is based upon and claims the benefit of priority of the prior Japanese Patent Application No. 2014-053600 filed on Mar. 17, 2014, the entire contents of which are incorporated herein by reference.

FIELD

The embodiments discussed herein are related to a high frequency module and a manufacturing method thereof.

BACKGROUND

Since an upper limit of signal frequency of a commercially available coaxial connector cable is 110 GHz, a waveguide is used to transmit a high frequency signal which exceeds 110 GHz. Further, in order to transmit a high frequency signal between a waveguide and a semiconductor chip, a microstrip line board is used to convert the signal in a planar transmission line. That is, a waveguide-microstrip line converter is used. Further, the semiconductor chip is mounted and connected to the microstrip line board by wire bonding or flip chip bonding.

For example, as illustrated in FIGS. 5A and 5B, a microstrip line board 102 is mounted in a space connected to a waveguide 101 in a metal case 100, to protrude into the waveguide 101. Further, a semiconductor chip 103 is mounted and connected to the microstrip line board 102 by wire bonding or flip chip bonding.

However, in the configuration illustrated in FIGS. 5A and 5B, since a high frequency signal is transmitted through the microstrip line and the wire bonding or the flip chip bonding, a high frequency characteristic significantly deteriorates when the high frequency signal is transmitted between the waveguide and the semiconductor chip.

For example, since the length of the microstrip line extending from the waveguide and the semiconductor chip is inevitably increased and the microstrip line is connected to the semiconductor chip by the wire bonding or the flip chip bonding, a signal loss caused by a line resistance is significant. Further, as the frequency of a transmitted signal becomes higher, the wavelength is shortened. Thus, when the length of the microstrip line to the semiconductor chip is one quarter or more of the wavelength, waveform deterioration is also caused by signal reflection. Therefore, the deterioration of the high frequency characteristic when the high frequency signal is transmitted between the waveguide and the semiconductor chip is significant.

The following are reference documents.
[Document 1] Japanese Laid-Open Patent Publication No. 2002-198712 and
[Document 2] Japanese Laid-Open Patent Publication No. H5-343904.

SUMMARY

According to an aspect of the invention, a high frequency module includes: a semiconductor chip provided over a first surface side of a resin layer; a first waveguide provided over the first surface side of the resin layer and sealed together with the semiconductor chip by a resin; a wire provided over a second surface side of the resin layer and electrically coupled to the semiconductor chip and extending to a position of the first waveguide; a second waveguide bonded to the first waveguide; and a metal plate provided over the first surface side of the resin layer at a position opposite to the first waveguide and electrically coupled to the wire, wherein a part of the wire extending to the position of the first waveguide serves as an antenna coupler.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 5A and 5B are schematic cross-sectional views illustrating a configuration of a high frequency module in the related art, in which FIG. 5A illustrates a case when wire bonding is used and FIG. 5B illustrates a case when flip chip bonding is used.

DESCRIPTION OF EMBODIMENTS

Hereinafter, a high frequency module and a manufacturing method thereof according to an exemplary embodiment of the present disclosure will be described with reference to FIGS. 1 to 4.

A high frequency module according to an exemplary embodiment is, for example, a high frequency module mounted in a radar, a sensor, or a wireless communication system which uses a high frequency wave such as a millimeter wave or a terahertz wave.

Figure 1:
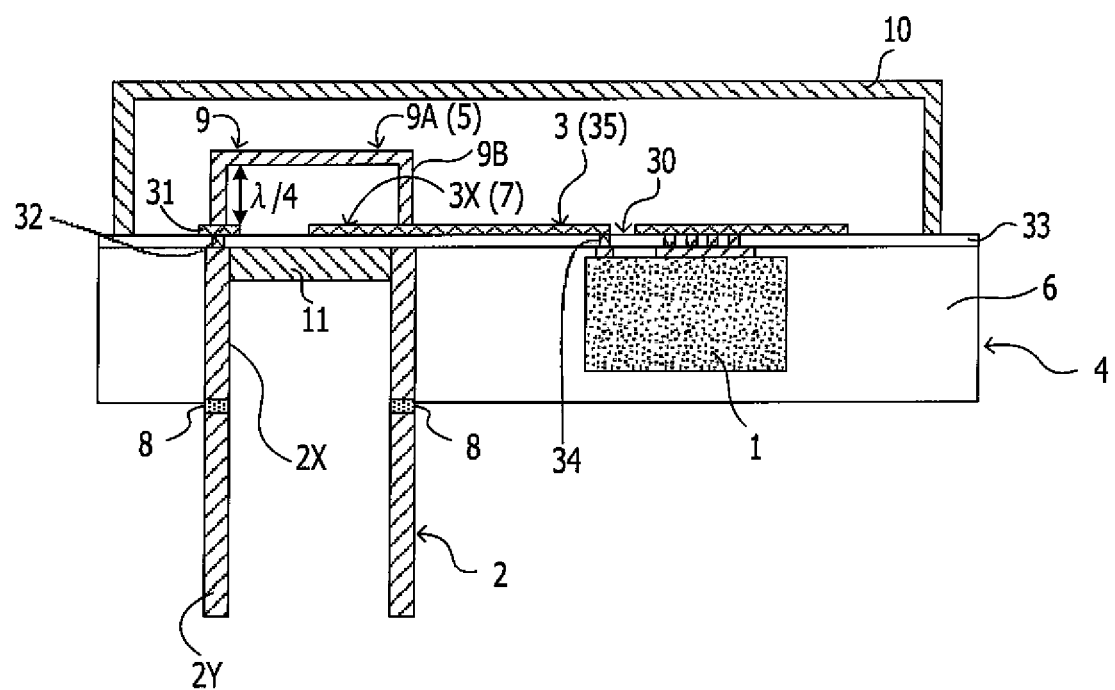
FIG. 1 is a schematic cross-sectional view illustrating a configuration of a high frequency module according to an exemplary embodiment.

As illustrated in FIG. 1, the high frequency module of the present exemplary embodiment includes a semiconductor chip 1, a part 2X of a waveguide 2, a package unit 4 including a rewiring line 3, a remaining part 2Y of the waveguide 2, and a back short 5. Here, since the waveguide 2 is a metal tube (a waveguide formed of a metal), the part 2X of the waveguide 2 is a part of the metal tube and the remaining part 2Y of the waveguide 2 is the remaining part of the metal tube. Further, the semiconductor chip 1 is also referred to as a "circuit chip".

Here, the package unit 4 includes the semiconductor chip 1, the part 2X of the waveguide 2 which is integrated with the semiconductor chip 1 using resin 6, and a rewiring line 3 which is electrically connected to the semiconductor chip 1 so that a part 3X located at one side of an extending direction of the part 2X of the waveguide 2 serves as an antenna coupler 7.

In other words, the package unit 4 includes the semiconductor chip 1, the part 2X of the waveguide 2, and the rewiring line 3. Here, the semiconductor chip 1 and the part 2X of the waveguide 2 are integrated with each other using the resin 6. Further, the rewiring line 3 electrically connected to the semiconductor chip 1, that is, a rewiring layer 30 including the rewiring line 3, is provided on the resin 6. The rewiring line 3 extends on an extension of the waveguide 2 and the part 3X of the rewiring line 3 located on the extension of the waveguide 2, that is, the part 3X of the rewiring line 3 located at one side of the extending direction of the part 2X of the waveguide 2 (the upper side of FIG. 1) is configured to serve as the antenna coupler 7. In this case, the rewiring line 3 (including the antenna coupler 7) is provided at the one side of the extending direction of the part 2X of the waveguide 2. The one side of the extending direction of the part 2X of the waveguide 2 refers to a side where a circuit surface of the semiconductor chip is provided. The rewiring layer 30 including the rewiring line 3 may be manufactured using a rewiring technique which is used, for example, for a Fan-out WLP (wafer level package). The part 2X of the waveguide 2 passes through the resin 6 at the rear side of the part 3X of the rewiring line 3 which serves as the antenna coupler 7, in the thickness direction. Further, the resin 6 is also referred to as a "package resin" or a "mold resin". Furthermore, the circuit surface of the semiconductor chip 1 is also referred to as a "chip surface", a "pad surface", or a "terminal surface".

The remaining part 2Y of the waveguide 2 is bonded to the part 2X of the waveguide 2 which is provided in the package unit 4, at the rear surface side of the package unit 4 (the lower side of FIG. 1). The remaining part 2Y of the waveguide 2 is provided at an opposite side (the lower side of FIG. 1) to the side where the circuit surface of the semiconductor chip 1 provided in the package unit 4 is provided, that is, at an opposite side to the side where the rewiring line 3 of the package unit 4 is provided, and bonded to the part 2X of the waveguide 2 provided in the package unit 4. In this case, the remaining part 2Y of the waveguide 2 is provided at the other side (the lower side of FIG. 1) which is opposite to the one side of the extending direction of the part 2X of the waveguide 2. For example, the remaining part 2Y of the waveguide 2 is boned to the part 2X of the waveguide 2 provided in the package unit 4 by a conductive adhesive 8 (for example, an Ag paste).

The back short 5 is provided at the opposite side to the part 2X of the waveguide 2 with the part 3X of the rewiring line 3 serving as the antenna coupler 7 being interposed therebetween so that the back short 5 is located on the extension of the part 2X of the waveguide 2 provided in the package unit 4, at the front surface side of the package unit 4 (i.e., the upper side of FIG. 1). That is, the back short 5 is provided at the side where the circuit surface of the semiconductor chip 1 is provided in the package unit 4 (the upper side of FIG. 1), that is, at the side where the rewiring line 3 of the package unit 4 is provided, so that the part 3X of the rewiring line 3 serving as the antenna coupler 7 is located between the back short 5 and the part 2X of the waveguide 2. In this case, the back short 5 is provided at the one side of the extending direction of the part 2X of the waveguide 2 (the upper side of FIG. 1). For example, a ground layer 31 (a rewiring ground line) is provided on the rewiring layer 30 provided at the front surface side of the package unit 4 along the end surface of the part 2X of the waveguide 2 buried in the resin 6, and the ground layer 31 is connected to an end surface of the part 2X of the waveguide 2 through a via 32. Further, in a bathtub-shaped metal member 9 (e.g., a bathtub-shaped copper member) including a bottom portion 9A and a frame-shaped side portion 9B, an end surface of the frame-shaped side portion 9B may be bonded onto the ground layer 31 so that the bottom portion 9A of the bathtub-shaped metal member 9 may serve as the back short 5. The bathtub-shaped metal member 9 is also referred to as a "metal block of a bathtub structure" (the bathtub shape: a plate having a concave center), or a "metal bathtub structure".

In this case, a depth of the bathtub-shaped metal member 9, that is, a distance between the antenna coupler 7 which is a part of the rewiring line 3 and the bottom portion 9A of the bathtub-shaped metal member 9, is set to be one quarter ($\lambda/4$) of a wavelength $\lambda$ of a high frequency signal to be transmitted. Here, the back short 5 is a ground surface spaced apart from the antenna coupler 7 by $\lambda/4$.

A cap 10 is provided to cover the entire front surface side of the package unit 4 including the back short 5 attached thereto as described above.

In the present exemplary embodiment, a dielectric plate is provided in the part 2X of the waveguide 2 to support a part serving as the antenna coupler of the rewiring line. That is, a dielectric plate 11 is provided at a side of the part 3X of the rewiring line 3 which serves as the antenna coupler 7 in the part 2X of the waveguide 2, and the part 3X of the rewiring line 3 which serves as the antenna coupler 7 is provided on the dielectric plate 11. The dielectric plate 11 is also referred to as a "plate-shaped dielectric material" or a "dielectric substrate". In this case, the front surface of the resin 6 at the rewiring line 3 side and the front surface of the dielectric plate 11 at the part 3X side of the rewiring line 3 serving as the antenna coupler 7 are disposed on the same plane. Further, the circuit surface of the semiconductor chip 1 and the front surface of the dielectric plate 11 are disposed on the same plane. Further, the rewiring layer 30 including the rewiring line 3 is provided on the dielectric plate 11, the resin 6, and the circuit surface of the semiconductor chip 1 which are disposed on the same plane.

When the dielectric plate 11 is provided to support the antenna coupler 7 which is a part of the rewiring line 3, a position of the antenna coupler 7 which is the part of the rewiring line 3 may be maintained. Therefore, deterioration of a gain or a high frequency characteristic may be suppressed.

Here, a material which has a dielectric tangent in a high frequency area as small as possible may be used for the dielectric plate 11 in view of reduction of loss (reduction of transmission loss of an electric wave). A value of the dielectric tangent (tan $\delta$) may approximately be 0.002 or less (1 GHz) and may approximately be 0.001 or less. When the required high frequency characteristic is less affected at a higher value than the above-mentioned values, the value may be used. However, since an increase of the dielectric tangent is higher in a high frequency region of approximately 100 GHz to approximately 300 GHz than that at approximately 1 GHz, the above-mentioned ranges may be used.

Especially, the dielectric plate 11 may be formed of a dielectric material having a low dielectric constant (a low dielectric constant material) or a low loss dielectric material (a low loss material). For example, the dielectric plate 11 may be formed of any one material selected from a group consisting of benzocyclobutene (BCB), a liquid crystal polymer (LCP), cycloolefin polymer (COP), polyolefin, polyphenylene ether (PPE), polystyrene, and polytetrafluoroethylene (PTFE: fluororesin). Therefore, the reduction of the high frequency gain may be suppressed to lower the loss. Further, such a dielectric plate 11 is also referred to as a "plate-shaped low dielectric constant dielectric material", a "low dielectric constant dielectric substrate", a "plate-shaped low loss dielectric material", or a "low loss dielectric substrate".

The thickness of the dielectric plate 11 may be approximately 100 μm or less. Therefore, the reduction of the high frequency gain may be suppressed.

In the present exemplary embodiment, the rewiring line 3 is configured by a line conductor 35 which is electrically connected to the semiconductor chip 1 through a via 34 which is provided in a resin layer 33 formed on the resin 6. Here, the line conductor 35 serving as the rewiring line 3 is electrically connected to the semiconductor chip 1 through the via 34. Further, the resin layer 33 is a photosensitive resin layer. Furthermore, the line conductor 35 is a metal wire which is formed of a metal such as copper.

The rewiring line 3 having the above-mentioned configuration may be formed by plating using a semi-additive method or formed by a metal paste (for example, a copper paste or silver paste) using, for example, an inkjet method. However, considering a cost and a mounting precision, the rewiring line may be formed by plating using the semi-additive method.

As described above, in manufacturing the high frequency module, the part 2X of the waveguide 2 and the semiconductor chip 1 are buried in the mold resin 6 and positions thereof are fixed to be integrated with each other, the rewiring line 3 including the antenna coupler 7 extending on the extension of the waveguide 2 is formed thereon to bond the remaining part 2Y of the waveguide 2 and the bathtub-shaped metal member 9 serving as the back short 5 to the package unit 4 which is electrically connected to the semiconductor chip 1, as illustrated in FIG. 1. That is, using a heterogeneous device integration technique and a rewiring technique, the part 2X of the waveguide 2 and the semiconductor chip 1 are integrated with each other using the mold resin 6, and the rewiring line 3 including the antenna coupler 7 is electrically connected to the semiconductor chip 1. Further, the remaining part 2Y of the waveguide 2 and the bathtub-shaped metal member 9 serving as the back short 5 are bonded to manufacture the high frequency module. When the high frequency module is manufactured as described above, not only the waveguide-line conversion (coaxial conversion) but also the semiconductor chip mounting may be achieved.

In this case, since the rewiring line 3 including the antenna coupler 7 is used so as to transmit a high frequency signal between the waveguide 2 and the semiconductor chip 1, the transmission length may be shortened. That is, since the distance between the antenna coupler 7 (a conversion unit) and the semiconductor chip 1 may be shortened, a transmission line may be shortened. Therefore, the transmission loss, that is, a signal loss (line loss) caused by a line resistance may be reduced. Further, as the frequency of a signal to be transmitted becomes higher, the wavelength of the signal is shortened. Even in this case, since the length to the semiconductor chip 1 may become shorter than one quarter of the wavelength, the deterioration of a waveform due to the signal reflection may be suppressed.

For example, even when a super-high frequency signal such as a millimeter wave or a terahertz wave is transmitted, deterioration of the waveform due to the signal reflection may also be suppressed. For example, with a high frequency signal of approximately 100 GHz, the wavelength is shortened to approximately 3 mm, and with a high frequency signal of approximately 300 GHz, the wavelength is shortened to approximately 1 mm. Even in this case, since the length to the semiconductor chip 1 may become shorter than one quarter of the wavelength, deterioration of the waveform due to the signal reflection may be suppressed. Therefore, when a high frequency signal is transmitted (input and output) between the waveguide 2 and the semiconductor chip 1, deterioration of a high frequency wave characteristic may be suppressed. That is, the deterioration of the high frequency characteristic in the transmission line extending from the semiconductor chip 1 to the waveguide 2 may be suppressed.

Since the package unit 4 in which the part 2X of the waveguide 2, the rewiring line 3 having the part 3X serving as the antenna coupler 7, and the semiconductor chip 1 are integrated is manufactured and the remaining part 2Y of the waveguide 2 and the bathtub-shaped metal member 9 serving as the back short 5 are bonded to the package unit 4, positional precision (mounting precision) of the waveguide 2 and the back short 5 with respect to the antenna coupler 7 is increased.

That is, the part 2X of the waveguide 2 and the semiconductor chip 1 are integrated using the resin 6, the rewiring line 3 including the part 3X serving as the antenna coupler 7 is formed on the resin 6 and the remaining part 2Y of the waveguide 2 and the bathtub-shaped metal member 9 serving as the back short 5 are bonded to the part 2X of the waveguide 2. Thus, the waveguide 2 or the back short 5 may be mounted with high positional precision with respect to the antenna coupler 7. Therefore, the characteristic may be suppressed from being significantly changed due to a mounting error or processing variation and conversion efficiency of waveguide-line conversion may be enhanced.

Figure 5A:
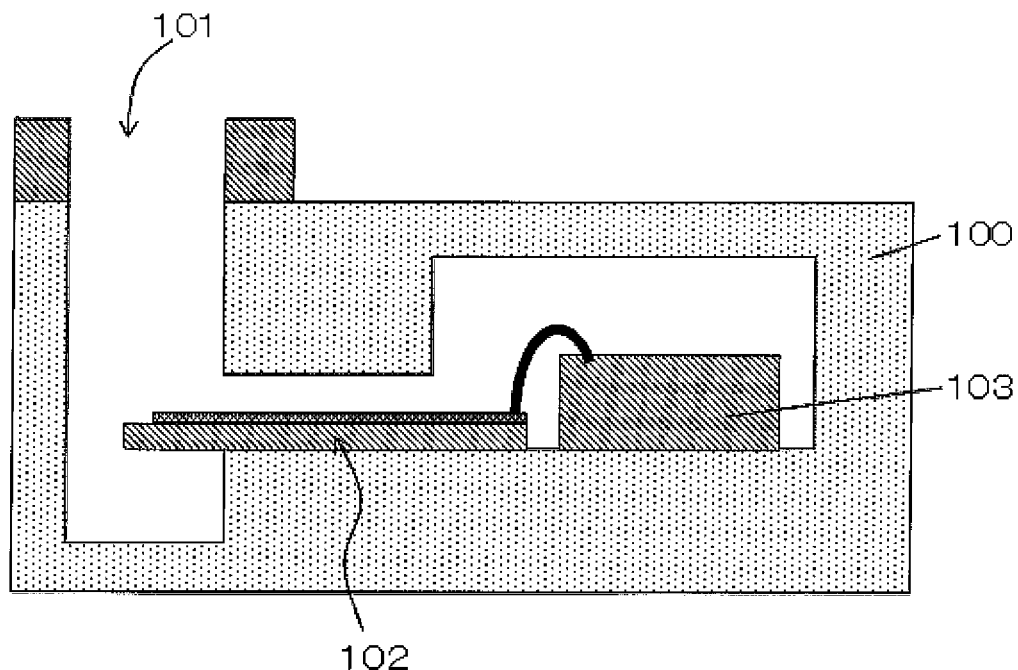
Figure 5B:
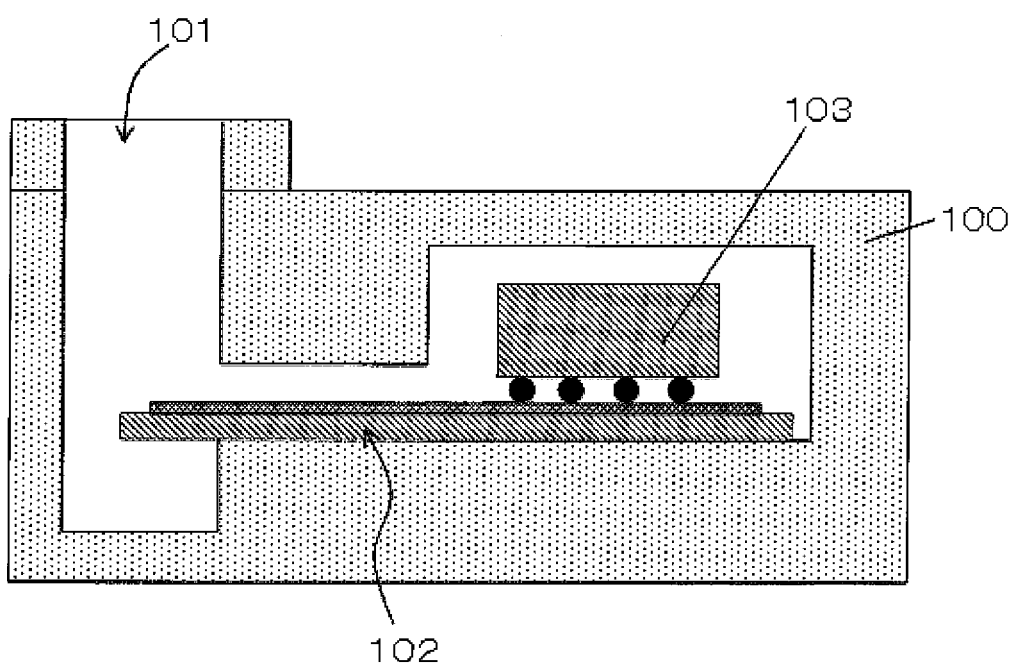

Whereas, when a microstrip line board is used as in the related art (see, e.g., FIGS. 5A and 5B), the characteristic (electric characteristic) is significantly changed due to the processing variation or the mounting precision of the microstrip line board. For example, when the super high frequency signal such as a millimeter or a terahertz wave is transmitted, the size of the waveguide or the distance from the microstrip line to the back short becomes in the order of the same as the thickness or the width of the microstrip line board.

For example, with a high frequency signal of approximately 100 GHz, the wavelength is shortened to approximately 3 mm and with a high frequency signal of approximately 300 GHz, the wavelength is shortened to approximately 1 mm. Thus, the thickness or the width of the microstrip line board becomes a size which is not negligible to the wavelength. Therefore, the characteristic is significantly changed by the processing variation of the microstrip line board. Further, when the microstrip line board is mounted, positioning in a vertical direction and a horizontal direction should be performed in consideration of the distance between the microstrip line and the back short and a protruding length in the waveguide of the microstrip line board. Therefore, it is difficult to perform the positioning precisely. Therefore, the characteristic is significantly changed depending on the mounting precision (a processing error and a mounting error) of the microstrip line board.

When the remaining part 2Y of the waveguide 2 or the bathtub-shaped metal member 9 serving as the back short 5 is bonded to the package unit 4 in which the part 2X of the waveguide 2, the rewiring line 3 having the part 3X serving as the antenna coupler 7, and the semiconductor chip 1 are integrated, not only the waveguide-line conversion but also the semiconductor chip mounting is achieved so that reduction of a size and a loss may be achieved.

When the rewiring line 3 including the part 3X serving as the antenna coupler 7 is used in the conversion unit between the semiconductor chip 1 and the waveguide 2, the microstrip line board which has been conventionally used for the conversion unit between the semiconductor chip and the waveguide of the related art in order to transmit a super-high frequency signal become needless so that reduction of the size and the loss may be achieved.

In the embodiment, the remaining part 2Y of the waveguide is bonded to the part 2X of the waveguide 2 at the opposite side to the side of the package unit 4 where the rewiring line 3 is provided, the bathtub-shaped metal member 9 serving as the back short 5 is provided to cover the surrounding of the part 3X of the rewiring line 3 serving as the antenna coupler 7, and only the upper side of the rewiring line 3 that transmits the high frequency signal between the rewiring line 3 serving as the antenna coupler 7 and the semiconductor chip 1 becomes a gap. Since the gap is small, leakage and propagation of an electric wave (signal) in a waveguide mode may be suppressed.

Whereas, when the microstrip line board is used as in the prior art (see, e.g., FIGS. 5A and 5B), the microstrip line board needs to be mounted in a space in the metal case which is connected to the waveguide. Therefore, since a large gap is formed at the upper side of the microstrip line board, it is difficult to suppress the electric wave from being leaked and propagating in the waveguide mode. Further, since there is limitation to reduce the thickness of the microstrip line board in order to secure the strength, it is also difficult to suppress the electric wave from being leaked and propagating through a lower substrate portion of the microstrip line.

The semiconductor chip 1 is also referred to as a "circuit chip", a "semiconductor circuit chip", or a "semiconductor integrated circuit chip". Further, the antenna coupler 7 is also referred to as a "converting coupler", a "current collecting coupler", or a "probe". Further, the product obtained by integrating the part 2X of the waveguide 2 and the semiconductor chip 1 using the resin 6 is also referred to as an "integrated body". Further, the high frequency module also has a function as the waveguide-antenna coupler/rewiring line converter or a probe-coupled converter. Therefore, the high frequency module is also referred to as a "signal converting module".

In the above-described exemplary embodiment, the rewiring line 3 is configured by the line conductor 35 which is electrically connected to the semiconductor chip 1 through the via 34 provided in the resin layer 33 formed on the resin 6, but is not limited thereto.

For example, the rewiring line may be configured by a line conductor which is electrically connected to the semiconductor chip through a via formed in a dielectric film provided on the resin. The dielectric film is also referred to as an "insulating film", a resin film, or an insulating resin film. The rewiring line with the above-mentioned configuration may be provided, for example, by providing a dielectric film including a conductor layer (e.g., a metal layer such as a copper foil) on the resin of the integrated body, patterning the conductor layer to form a line conductor, and forming the via in the dielectric film.

The rewiring line may be provided, for example, by bonding the dielectric film to which the metal layer is attached through a bonding layer, onto the resin of the integrated body, and then patterning the metal layer and forming the via in the dielectric film. Here, the dielectric film may be formed of a dielectric material having a low dielectric constant (a low dielectric constant material) or a low loss dielectric material (a low loss material).

For example, the dielectric film may be formed of any one material selected from a group consisting of benzocyclobutene (BCB), a liquid crystal polymer, cycloolefin polymer (COP), polyolefin, polyphenylene ether (PPE), polystyrene, and polytetrafluoroethylene. Further, the dielectric film formed of the low dielectric constant material is also referred to as a "low dielectric material film". Further, any of the patterning of the conductor layer or the forming of the via may be performed first.

The rewiring line may also be provided, for example, by mounting the dielectric film patterned with the rewiring line, onto the resin of the integrated body. The rewiring line may also be provided, for example, by providing the dielectric film including a via and a line conductor connected to the via on the resin of the integrated body. For example, the dielectric film patterned with the line conductor as the rewiring line and the via may be bonded onto the resin of the integrated body using an adhesive. In this case, a conductive adhesive may be used to bond the via patterned in the dielectric film and the peripheral region thereof, and a low-dielectric and low-loss adhesive may be used to bond the other region. In consideration of the cost and the mounting precision, the rewiring line may be provided by mounting the dielectric film on the resin of the integrated body and then patterning the rewiring line.

Next, a manufacturing method of a high frequency module according to the present exemplary embodiment will be described.

First, a package unit 4 is manufactured, including a semiconductor chip 1, a part 2X of a waveguide 2 integrated with the semiconductor chip 1 by resin 6, and a rewiring line 3 which is electrically connected to the semiconductor chip 1 and has a part 3X located at one side of an extending direction of the part 2X of the waveguide 2 to serve as an antenna coupler 7 (a process of manufacturing a package unit).

Figure 3A:
FIGS. 3A to 3F are schematic cross-sectional views for explaining a manufacturing method of a high frequency module (a manufacturing method of a package unit) according to an exemplary embodiment.
Figure 3B:
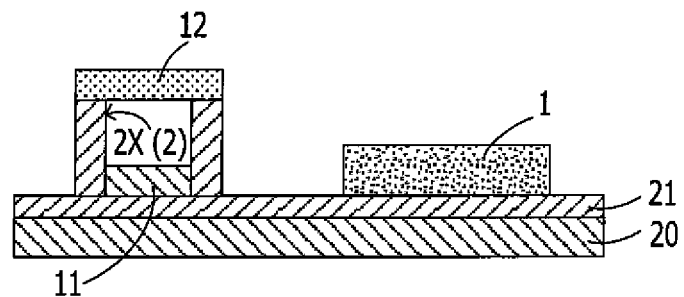
Figure 3C:
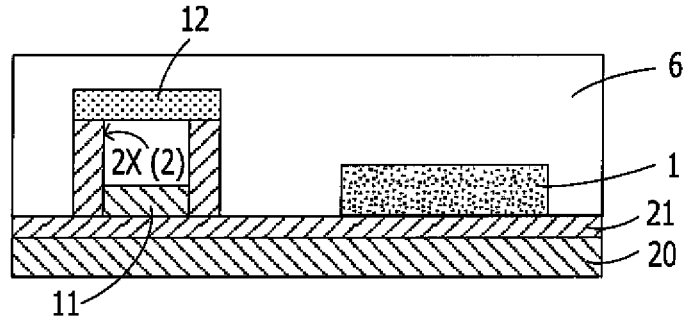

That is, at first, the semiconductor chip 1 and the part 2X of the waveguide 2 are integrated using the resin 6 (see FIG. 3C). Next, the rewiring line 3 is provided to be electrically connected to the semiconductor chip 1 (see FIG. 3F).

Figure 2:
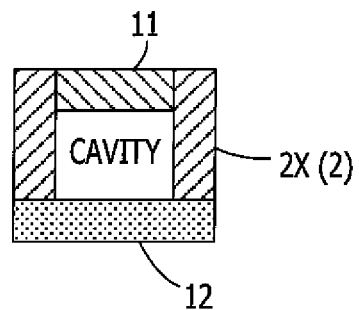
FIG. 2 is a schematic view for explaining a part of a waveguide which is buried in a resin in a manufacturing method of a high frequency module (a manufacturing method of a package unit) according to an exemplary embodiment.

Especially, before integrating the semiconductor chip 1 and the part 2X of the waveguide 2 using the resin 6, a dielectric plate 11 may be provided at one side of an extending direction of the part 2X of the waveguide 2 in the part 2X of the waveguide 2 (see FIG. 2). That is, the process of manufacturing the semiconductor unit 4 may include a process of providing the dielectric plate 11 at one side of the extending direction of the part 2X of the waveguide 2 in the part 2X of the waveguide 2. In this case, the dielectric plate 11 may be provided so that the circuit surface of the semiconductor chip 1 and the front surface of the dielectric plate 11 are disposed on the same plane (see FIGS. 2 and 3B).

In addition, before integrating the semiconductor chip 1 and the part 2X of the waveguide 2 using the resin 6, a cover 12 may be provided at the other side of the extending direction of the part 2X of the waveguide 2 to cover the part 2X of the waveguide 2 (see FIG. 2). That is, the process of manufacturing the semiconductor unit 4 may include a process of providing the cover 12 at the other side of the extending direction of the part 2X of the waveguide 2 to cover the part 2X of the waveguide 2 (see FIGS. 2 and 3B). In this case, after integrating the semiconductor chip 1 and the part 2X of the waveguide 2 by the resin 6, the resin 6 and the cover 12 at the other side of the extending direction of the part 2X of the waveguide 2 may be removed (see FIG. 3E).

When the package unit 4 is manufactured as described above, the process of providing the rewiring line 3 may include a process of forming a resin layer 33 on the resin 6, a process of forming a via 34 in the resin layer 34, and a process of forming a line conductor 35 on the resin layer 33.

For example, using a semi-additive method or an inkjet method is included in this process. Further, the process of providing the rewiring line 3 may include a process of providing a dielectric film having a conductor layer on the resin, a process of forming a via in the dielectric film, and a process of patterning the conductor layer to form a line conductor.

For example, a process of patterning the rewiring line after attaching the dielectric film including the conductor layer on the resin of an integrated body is included in this process. Further, any of the process of forming the via and the process of forming the line conductor may be performed first. Further, in the process of providing the rewiring line 3, the dielectric film including the via and the line conductor connected to the via may be provided on the resin. For example, a process of attaching the dielectric film patterned with the rewiring line on the resin of the integrated body is included in this process.

The remaining part 2Y of the waveguide 2 is bonded onto the package unit 4 manufactured as described above and the back short 5 is provided (see FIGS. 4A and 4B).

That is, the remaining part 2Y of the waveguide 2 is bonded to the part 2X of the waveguide 2 provided in the package unit 4 manufactured as described above to be located at an opposite side of the one side of the extending direction of the part 2X of the waveguide 2. Further, in the package unit 4 manufactured as described above, the back short 5 is provided so that the back short 5 is located at the one side of the extending direction of the part 2X of the waveguide 2 and the part 3X of the rewiring line 3 serving as an antenna coupler 7 is located between the back short 5 and the part 2X of the waveguide 2.

Hereinafter, as an example, a case of forming the rewiring line 3 by plating using a semi-additive method will be described with reference to FIGS. 2 to 4.

First, as illustrated in FIG. 2, a cover 12 is provided below the part 2X of the waveguide 2, that is, on a bottom surface of the part 2X of the waveguide 2 so as to prevent the mold resin 6 from flowing into the part 2X of the waveguide 2 at the time of molding. For example, the cover 12 may be bonded to the bottom surface of the part 2X of the waveguide 2 so as to close an opening below the part 2X of the waveguide 2. The cover 12 is entirely removed during a process of back-grinding the molding resin 6 to be described below so that the material of the cover is not specifically limited. Therefore, the material of the cover 12 may be a conductor such as a metal (for example, copper) or an insulator.

A dielectric plate 11 configured to support the antenna coupler 7 which is a part of the rewiring line 3 is provided above the part 2X of the waveguide 2, that is, on the top surface of the part 2X of the waveguide 2. For example, the dielectric plate 11 may be positioned in the upper opening of the part 2X of the waveguide 2 using a chip mounter or a chip bonder (a flip chip bonder) and load may be applied to the dielectric plate 11 so that the dielectric plate 11 may be inserted into the opening of the part 2X of the waveguide 2 and fitted to the inside of the part 2X of the waveguide 2.

For example, when a high frequency signal of approximately 300 GHz is transmitted, the size of the part 2X of the waveguide 2 may be set such that the inner longitudinal and lateral lengths are approximately 500 μm, the height (the length in the extending direction of the part 2X of the waveguide 2: the vertical length in FIG. 2) is approximately 400 μm, and the thickness is approximately 100 μm, the cover 12 having the longitudinal and lateral lengths of approximately 700 μm and the thickness of approximately 100 μm is bonded to the bottom surface of the part 2X of the waveguide 2, and the dielectric plate 11 having the horizontal and vertical lengths of approximately 500 μm and the thickness of approximately 100 μm may be fitted in the upper side.

In this way, the height of the part 2X of the waveguide 2 provided with the cover 12 and the dielectric plate 11 is approximately 500 μm. Here, since a case where a high frequency signal of approximately 300 GHz is transmitted is described as an example, the inner longitudinal and lateral lengths of the part 2X of the waveguide 2 is set to be approximately 500 μm but is not limited thereto. The longitudinal and lateral lengths of the part 2X may be determined depending on the frequency (wavelength) of the high frequency signal to be transmitted. For example, the longitudinal and lateral lengths may be set to be approximately 400 μm to approximately 1 mm.

In this way, the part 2X of the waveguide 2 is configured to have a hollow structure such that the dielectric plate 11 is attached to the upper opening, the cover 12 is attached to the opposite lower opening, and an inside has a cavity.

Next, as illustrated in FIGS. 3A to 3C, the semiconductor chip 1 and the part 2X of the waveguide 2 provided with the cover 12 and the dielectric plate 11 as described above are integrated with each other using the resin 6.

That is, as illustrated in FIGS. 3A and 3B, the semiconductor chip 1 and the part 2X of the waveguide 2 provided with the cover 12 and the dielectric plate 11 as described above are disposed on an adhesive surface of an adhesive sheet provided on a supporting substrate 20. That is, the part 2X of the waveguide 2 provided with the cover 12 and the dielectric plate 11 as described above are temporarily fixed at a desired position on the adhesive sheet 21 provided on a supporting substrate 20 so that the circuit surface of the semiconductor chip 1 and the dielectric plate insertion side of the part 2X of the waveguide 2 provided with the cover 12 and the dielectric plate 11 as described above face downwardly. The adhesive sheet 21 is also referred to as a "slightly adhesive sheet".

For example, the chip bonder or the chip mounter may be used for the temporary fixation. Therefore, the semiconductor chip 1 and the part 2X of the waveguide may be mounted with a precise positional relationship.

Here, as for the supporting substrate 20, for example, a Si substrate (a Si wafer), a glass substrate, a metal plate such as an aluminum plate, a stainless steel plate, or a copper plate, a polyimide film, or a printed board may be used.

As for the adhesive sheet 21, a sheet including an adhesive provided on a highly heat-resistant base member such as polyimide resin, silicon resin, or fluorine resin, may be used. Further, the adhesive sheet 21 may be attached to the supporting substrate 20. The adhesive sheet 21 may be attached to the supporting substrate 20 by, for example, an adhesive provided on the rear surface of the base member of the adhesive sheet 21. Further, the adhesive sheet 21 may have a single-layered structure or a multi-layered structure having two or more layers. Further, the adhesive may be directly provided on the supporting substrate 20 without using the adhesive sheet 21. Further, as for a material of the adhesive, for example, epoxy resin, acrylic resin, polyimide resin, silicon resin, or urethane resin may be used. The adhesive sheet 21 is also referred to as an "adhesive film".

The adhesive sheet 21 is required that its adhesiveness is not lowered by heating at the time of molding and a molded article is easily peeled off without lowering the adhesiveness after forming the molded article (integrated body: a pseudo wafer) by molding. Therefore, in the horizontal direction, the adhesive sheet 21 may have a strength up to an amount that prevents a displacement of the semiconductor chip 1 or the part 2X of the waveguide 2. In the vertical direction, a bump where a cavity such as a crater is open may be formed on the surface of the adhesive sheet 21 so as to be easily peeled off.

Next, as illustrated in FIG. 3C, the semiconductor chip 1 and the part 2X of the waveguide 2 provided with the cover 12 and the dielectric plate 11 as described above are buried in the molding resin 6 to be integrated with each other (a molding process). That is, the semiconductor chip 1 and the part 2X of the waveguide 2 provided with the cover 12 and the dielectric plate 11 as described above are sealed by the molding resin 6. For example, when the size of the part 2X of the waveguide 2 is set such that the inner longitudinal and lateral lengths are approximately 500 μm, the height is approximately 400 μm, and the thickness of approximately 100 μm and the cover 12 having longitudinal and lateral lengths of approximately 700 μm and a thickness of approximately 100 μm are bonded to the part 2X of the waveguide 2, the part 2X of the waveguide 2 may be entirely molded with the resin 6 having a thickness of approximately 700 μm.

Here, as for the molding resin 6, an epoxy-based resin, a cycloolefin-based resin, an acryl-based resin, or a polyimide-based resin may be used. Further, if necessary, the molding resin 6 may contain alumina, silica, aluminum nitride, or aluminum hydroxide, as an inorganic filler.

The part 2X of the waveguide 2 may have a height that is capable of being molded (e.g., approximately 500 μm to approximately 600 μm).

Figure 3D:
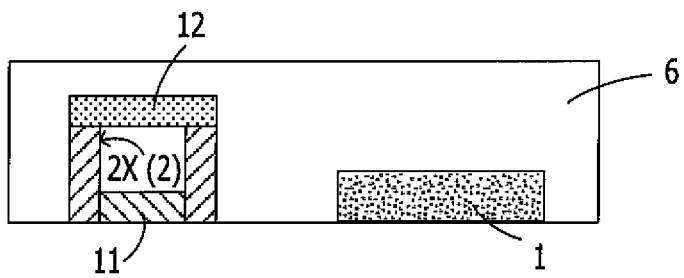

Next, as illustrated in FIG. 3D, the supporting substrate 20 and the adhesive sheet 21 are peeled off (removed).

Figure 3E:
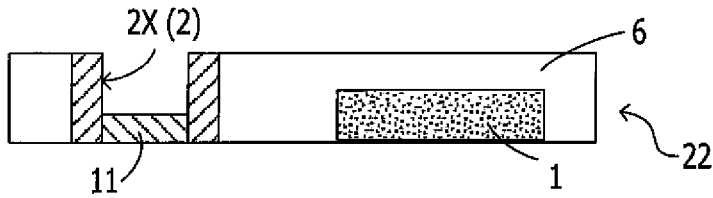

Next, as illustrated in FIG. 3E, the molding resin 6 is back-grinded until the part 2X of the waveguide 2 is exposed through the rear surface (back surface: the upper surface in FIG. 3E) of the molding resin 6 (to a position where the cover 12 attached to the part 2X of the waveguide 2 disappears). That is, the resin 6 and the cover 12 at the other side of the extending direction of the part 2X of the waveguide 2 are removed. Therefore, the cavity of the part 2X of the waveguide 2 is exposed to open the other side (the upper side of FIG. 3E) of the part 2X of the waveguide 2.

Here, the rear surface of the molding resin 6 refers to the surface opposite to the surface where the dielectric plate 11 provided in the part 2X of the waveguide 2 and the circuit surface of the semiconductor chip 1 are exposed. For example, when the size of the part 2X of the waveguide 2 is set such that the inner longitudinal and lateral lengths are approximately 500 μm, the height is approximately 400 μm, and the thickness is approximately 100 μm, the cover 12 having a size of longitudinal and lateral lengths of approximately 700 μm and a thickness of approximately 100 μm is bonded to the part 2X of the wave guide 2, and the part 2X of the waveguide 2 is entirely molded with the resin having a thickness of approximately 700 μm, the part 2X of the waveguide 2 may be back-grinded (BG) until the thickness of the molding resin 6 becomes approximately 400 μm. Therefore, the cover 12 is removed and the cavity of the part 2X of the waveguide 12 is exposed to open the other side (the upper side in FIG. 3E) of the part 2X of the waveguide 2.

In this way, an integrated body 22 molded with a resin composition (a pseudo wafer; mold wafer) is manufactured.

Here, the integrated body 22 in which the semiconductor chip 1 and the part 2X (including the dielectric plate 11 therein) of the waveguide 2 are integrated with each other may have a circular shape like a wafer or a rectangular shape. For example, when the integrated body has a circular shape like a wafer, a semiconductor manufacturing facility may be used to form the rewiring line and when the integrated body has a rectangular shape, a printed wiring board manufacturing facility may be used to form the rewiring line.

Figure 3F:
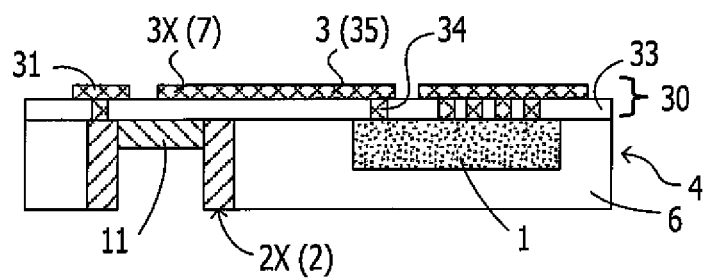

Next, as illustrated in FIG. 3F, the rewiring line 3 which is electrically connected to the semiconductor chip 1 is provided (a rewiring process). That is, the rewiring line 3 electrically connected to the semiconductor chip 1 is provided and the part 3X of the rewiring line 3 located at the one side of the extending direction of the part 2X of the waveguide 2 becomes the antenna coupler 7. Here, on the molding resin 6 in which the semiconductor chip 1 and the part 2X of the waveguide 2 are buried, the rewiring line 3 including the part 3X serving as the antenna coupler 7 is provided to extend to the dielectric plate 11 which is provided at the one side of the part 2X of the waveguide 2 on the circuit surface of the semiconductor chip 1. In this case, the rewiring line 3 is provided on the side of the integrated body 22 where the dielectric plate 11 provided in the part 2X of the waveguide 2 and the circuit surface of the semiconductor chip 1 are exposed. Further, the part 3X located on the dielectric plate 11 of the rewiring line 3 becomes the antenna coupler 7. Therefore, the antenna coupler 7 is provided on the dielectric plate 11 provided at the one side of the part 2X of the waveguide 2 buried in the molding resin 6.

That is, a photosensitive resin is applied to the integrated body 22 manufactured as described above on the side where the dielectric plate 11 provided in the part 2X of the waveguide 2 and the circuit surface of the semiconductor chip 1 are exposed to form a photosensitive resin layer 33 (an insulating layer) and form a via hole therein.

For example, a photosensitive epoxy resin (photosensitive epoxy varnish) may be applied by a spin coat method and pre-bake, exposure, development, curing, and oxygen plasma processes are performed thereon to form a photosensitive epoxy resin layer 33 having a via hole (a through hole; a through via) with a thickness of approximately 8 μm. In this case, the via hole formed above the circuit surface of the semiconductor chip 1 may be formed to have a diameter of approximately 30 μm at the surface electrode side provided on the circuit surface of the semiconductor chip 1 and a diameter of 100 μm at the front surface of the photosensitive epoxy resin layer 33.

Next, although not illustrated, a seed layer is formed. For example, a seed layer made of copper or a copper alloy is formed by sputtering or electroless plating. Further, in order to increase the adhesiveness between the photosensitive resin layer 33 and the seed layer, for example, an adhesion layer made of Ti, Cr, W, or an alloy thereof may be formed. For example, titanium and copper may be deposited to have thicknesses of approximately 0.1 μm and approximately 0.3 μm, respectively, by the sputtering to form the adhesion layer and the seed layer. Further, the entire layer including the adhesion layer may be referred to as a "seed layer".

Next, although not illustrated, a resist pattern is formed on the seed layer in order to form the line conductor 35 and the via 34 as the rewiring line 3. That is, a resist pattern (a photoresist pattern) opened at the portions where the line conductor 35 and the via 34 as the rewiring line 3 are formed is formed on the seed layer.

Next, when copper is plated using the seed layer, for example, by an electroplating method, the via 34 is formed in the via hole and the line conductor 35 (here, including the part serving as the antenna coupler 7) as the rewiring line 3 is formed on the photosensitive resin layer 33. In this process, for example, another via, a rewiring ground layer 31, or a rewiring signal line may be formed. After peeling off the resist (photoresist), for example, the seed layer remaining below the resist is removed, for example, by a wet etching method or a dry etching method.

In this way, the rewiring line 3, which is configured by the copper wire 35 (a metal wire; a line conductor) electrically connected to the semiconductor chip 1 through the via 34 provided on the photosensitive resin layer 33 formed on the molding resin 6, is formed. The rewiring line 3 is formed to include the part 3X which extends to the upper area of the part 2X of the waveguide 2, that is, onto the dielectric plate 11 and serves as the antenna coupler 7.

When the wiring line is patterned after attaching the dielectric film having a conductor layer on the resin of the integrated body, the wiring line may be formed as follows. That is, the integrated body manufactured as described above is laminated on the dielectric film (e.g., a liquid crystal polymer) to which the conductor layer (a metal layer, e.g., a copper foil) is bonded through the adhesive layer. Next, the conductor layer is etched using the resist pattern to form the line conductor serving as the rewiring line. Next, the via hole may be formed in the dielectric film using, for example, a laser and the via may be formed in the via hole. Further, when the dielectric film patterned with the rewiring line is attached on the resin of the integrated body, the dielectric film patterned with the rewiring line is attached on the integrated body manufactured as described above.

In this way, the integrated body 22 including the rewiring line 3, that is, the package unit 4 is manufactured.

Figure 4A:
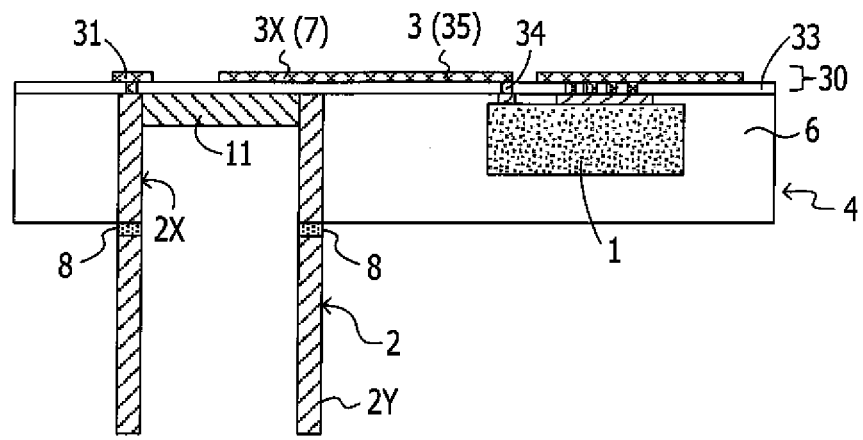
FIGS. 4A and 4B are schematic cross-sectional views for explaining a manufacturing method of a high frequency module (a process of bonding a remaining part of a waveguide and a process of bonding a back short) according to an exemplary embodiment.
Figure 4B:
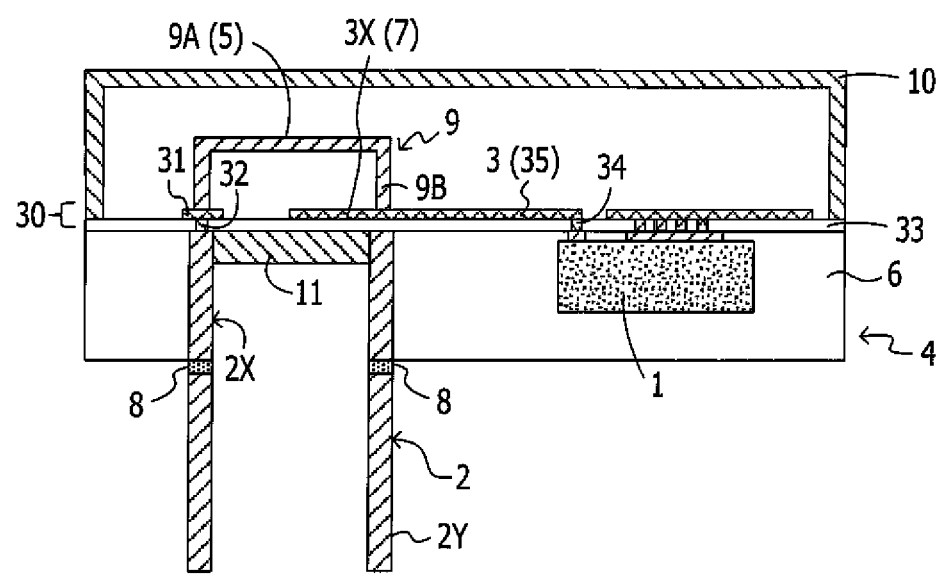

Next, as illustrated in FIGS. 4A and 4B, the remaining part 2Y of the waveguide 2 is bonded onto the package unit 4 manufactured as described above and the back short 5 is provided.

That is, as illustrated in FIG. 4A, the remaining part 2Y of the waveguide 2 is bonded to the part 2X of the waveguide 2 provided in the package unit 4 manufactured as described above to be located at the opposite side (the lower side of FIG. 4A) to the one side of the extending direction of the part 2X of the waveguide 2. For example, the remaining unit 2Y of the waveguide 2 is bonded (adhered; connected) to the end (the opening) of the part 2X of the waveguide which is exposed on the rear surface of the package unit 4, for example, using a conductive adhesive 8 (a conductive material) such as Ag paste.

Here, the other side opposite to the one side of the extending direction of the part 2X of the waveguide 2, that is, the rear surface of the package unit 4 is the opposite side to the side where the rewiring line 3 is provided. Therefore, the remaining part 2Y of the waveguide 2 is fixed to the part 2X of the waveguide 2 provided in the package unit 4, that is, the part 2X of the waveguide 2 buried in the molding resin 6, by the conductive adhesive 8 and the length of the waveguide 2 extends to be the waveguide 2 having a predetermined length and thus the waveguide 2 is completed.

Further, the bonding of the part 2X and the remaining part 2Y of the waveguide 2 is not limited to that described above, and for example, another bonding method such as diffusion bonding or welding may be used. The part 2X of the waveguide 2 provided in the package unit 4, that is, the part 2X of the waveguide 2 buried in the molding resin 6 is also referred to as an "inside waveguide" or an "internal waveguide", and the remaining part 2Y of the waveguide 2 is also referred to as an "outside waveguide" or an "external waveguide".

As illustrated in FIG. 4B, in the package unit 4 manufactured as described above, the back short 5 is provided to be located at the one side (the upper side of FIG. 4B) of the extending direction of the part 2X of the waveguide 2 so that the part 3X of the rewiring line 3 serving as an antenna coupler is located between the back short 5 and the part 2X of the waveguide 2. That is, the bathtub-shaped metal member 9 is covered on the upper side of the part 3X serving as the antenna coupler 7 of the rewiring line 3 provided on the front surface of the package unit 4 to provide the back short 5. Here, the one side of the extending direction of the part 2X of the waveguide 2, that is, the front surface of the package unit 4 is the side where the rewiring line 3 is provided.

For example, the ground layer 31 (the rewiring ground line) is provided on the rewiring layer 30 provided on the front surface side of the package unit 4 along the end surface of the part 2X of the waveguide 2 buried in the resin 6, and the ground layer 31 is connected to the end surface of the part 2X of the waveguide 2 through the via 32. Further, an end surface of a frame-shaped side 9B of a bathtub-shaped metal member 9 having a bottom portion 9A and the frame shaped side 9B is bonded onto the ground layer 31 so that the bottom portion 9A of the bathtub-shaped metal member 9 serves as the back short 5.

In the present exemplary embodiment, a cap 10 formed of ceramic is provided to cover the entire front surface side of the package unit 4 where the back short 5 is attached as described above, to hermetically seal the package unit 4.

In this way, the high frequency module according to the present exemplary embodiment may be manufactured.

According to the high frequency module according to the present exemplary embodiment and the manufacturing method thereof, the deterioration of the high frequency characteristic when the high frequency signal is transmitted between the waveguide 2 and the semiconductor chip 1 may be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A high frequency module, comprising:
 a semiconductor chip provided over a first surface side of a first resin;
 a first waveguide provided over the first surface side of the first resin and sealed together with the semiconductor chip by a second resin;
 a wire provided over a second surface side of the first resin and electrically coupled to the semiconductor chip and extending to a position of the first waveguide;
 a second waveguide bonded to the first waveguide; and
 a metal plate provided over the first surface side of the first resin at a position opposite to the first waveguide and electrically coupled to the wire,
 wherein a part of the wire extending to the position of the first waveguide serves as an antenna coupler.

2. The high frequency module according to claim 1, further comprising:
 a dielectric plate provided within the first waveguide.

3. The high frequency module according to claim 2, wherein the dielectric plate is formed of any one material selected from a group consisting of benzocyclobutene, a liquid crystal polymer, a cycloolefin polymer, polyolefin, polyphenylene ether, polystyrene, and polytetrafluoroethylene.

4. The high frequency module according to claim 1, wherein the wire is electrically coupled to the semiconductor chip through a via provided in the first resin.

5. The high frequency module according to claim 1, wherein the first resin is formed of a dielectric film, and the dielectric film is formed of any one material selected from a group consisting of benzocyclobutene, a liquid crystal polymer, cycloolefin polymer, polyolefin, polyphenylene ether, polystyrene, and polytetrafluoroethylene.

* * * * *